United States Patent [19]
Copp

[11] Patent Number: 5,987,736
[45] Date of Patent: Nov. 23, 1999

[54] PRINTED CIRCUIT BOARD FABRICATION APPARATUS

[76] Inventor: John B. Copp, 1208 Luanne, Fullerton, Calif. 92631

[21] Appl. No.: 08/609,774

[22] Filed: Mar. 1, 1996

[51] Int. Cl.$^6$ ..................................................... B23P 19/00
[52] U.S. Cl. ........................... 29/738; 29/33 R; 29/33.52; 29/430; 29/771; 29/830
[58] Field of Search ............................... 29/738, 430, 830, 29/469.5, 33 R, 33.52, 771; 83/277, 650, 206, 649, 409, 409.1, 227, 288; 156/228, 299, 563, 556, 580; 428/901, 461, 849; 271/33; 294/98.1

[56] References Cited

U.S. PATENT DOCUMENTS

| | | | |
|---|---|---|---|
| 3,617,613 | 11/1971 | Benzinger et al. . | |
| 3,847,656 | 11/1974 | Baumann et al. | 428/481 |
| 3,955,264 | 5/1976 | Klappert | 29/738 X |
| 4,488,466 | 12/1984 | Jones . | |
| 4,831,718 | 5/1989 | Zumstein et al. . | |
| 4,857,135 | 8/1989 | Copp | 156/580 |
| 5,007,626 | 4/1991 | Blaimschein | 271/33 |
| 5,160,567 | 11/1992 | Konicek et al. | 156/288 |
| 5,249,902 | 10/1993 | Stankiewicz | 29/771 X |
| 5,315,754 | 5/1994 | Klappert et al. | 29/738 X |
| 5,325,583 | 7/1994 | Shimizu et al. | 29/849 |
| 5,403,056 | 4/1995 | Wallace | 294/98.1 |
| 5,528,817 | 6/1996 | Klappert et al. | 29/738 X |

FOREIGN PATENT DOCUMENTS

| | | |
|---|---|---|
| 6-171814 | 6/1994 | Japan . |
| 772706 | 3/1980 | U.S.S.R. . |
| 1007221 | 3/1983 | U.S.S.R. . |
| 2255451 | 11/1992 | United Kingdom . |

*Primary Examiner*—Lee Young
*Assistant Examiner*—Rick Kiltae Chang
*Attorney, Agent, or Firm*—Knobbe, Martens, Olson & Bear, LLP.

[57] ABSTRACT

An apparatus for assembling copper-caul-copper elements to be used in the fabrication of printed circuit boards. The apparatus comprises a roll section which has two rolls of copper that provides the rolled copper sheets to a cutting section. The cutting section includes two clamp mechanisms which clamps the two rolled copper sheets and a cutting apparatus that cuts the two rolled copper sheets to produce two cut sheets of copper. The apparatus includes a grasping device that reaches into the cutting section to partially extract the rolled copper sheets prior to cutting. The apparatus also includes a carriage section and a caul supply section. After the rolled copper sheets have been cut, the grasping device extracts the copper sheets and positions these sheets in the carriage assembly as the caul supply section is simultaneously supplying the caul to the carriage. The carriage section has two guide rails which support the caul and the grasping device is capable of positioning one cut sheet of copper on the top side of the caul and the other cut sheet of copper on the bottom side of the caul to produce the copper-caul-copper element.

27 Claims, 11 Drawing Sheets

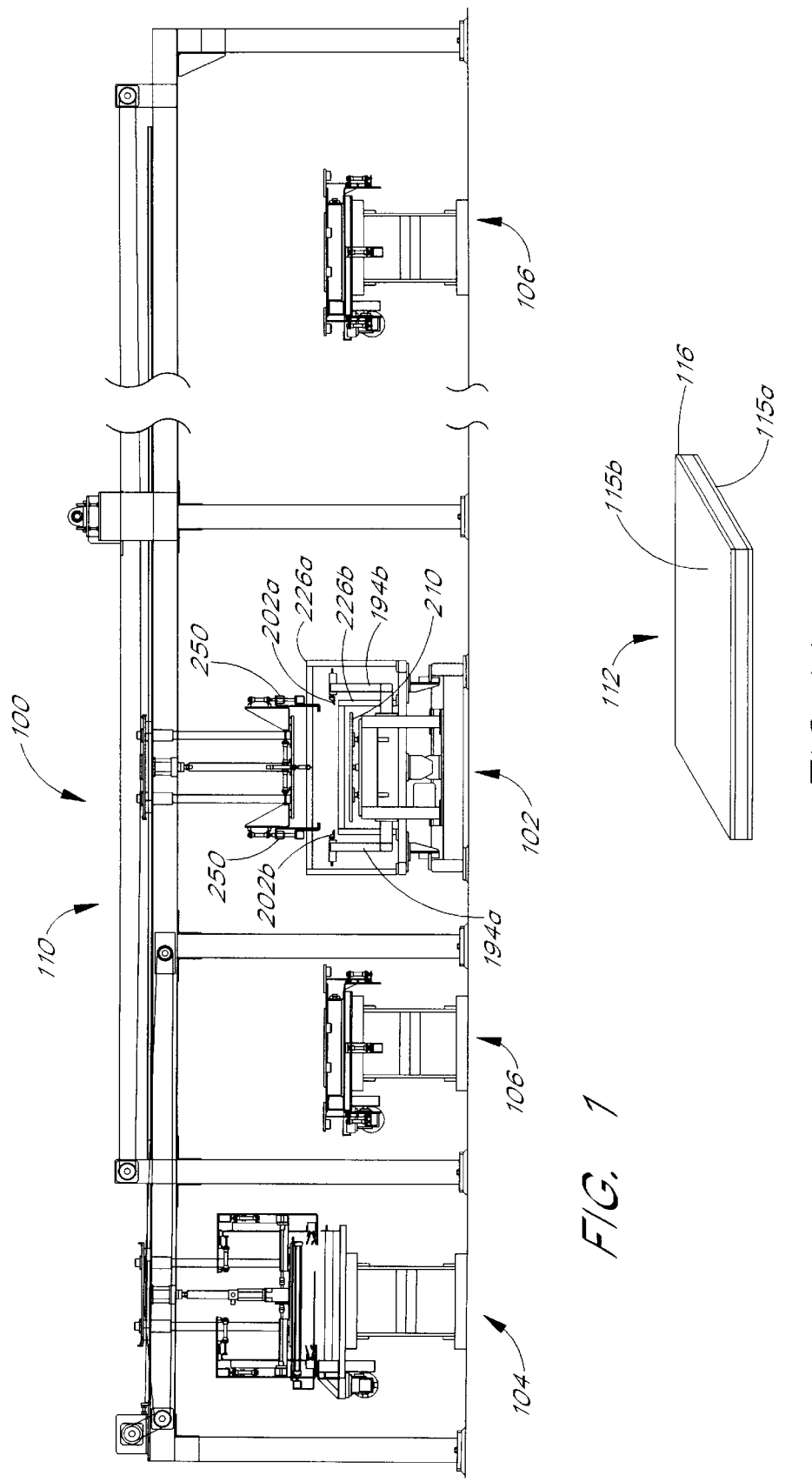

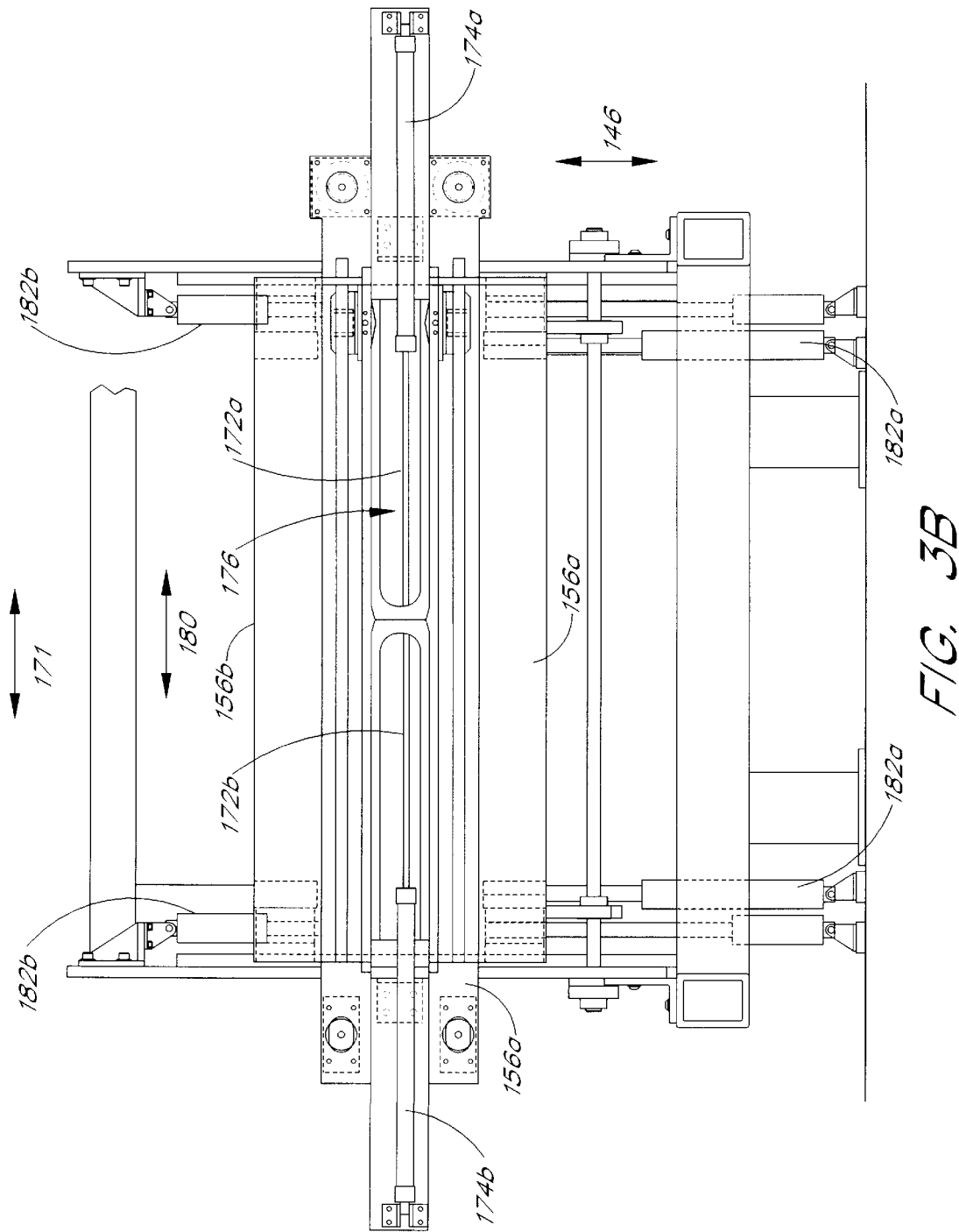

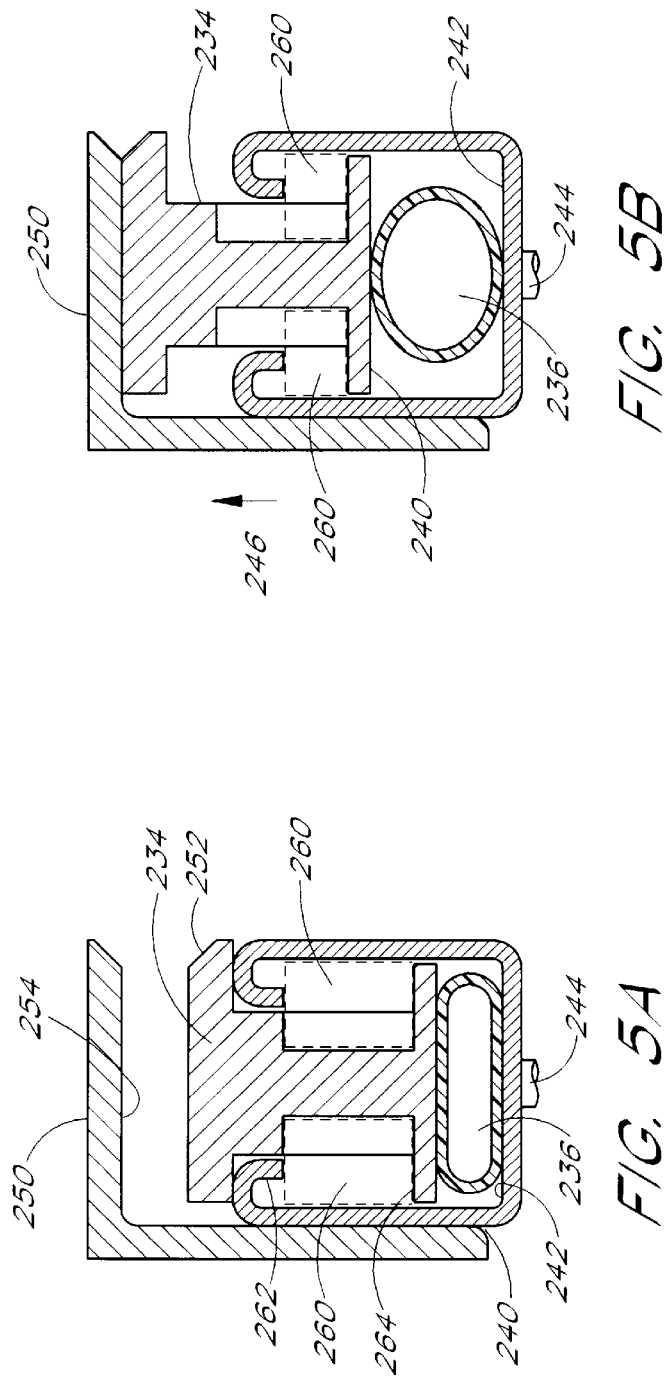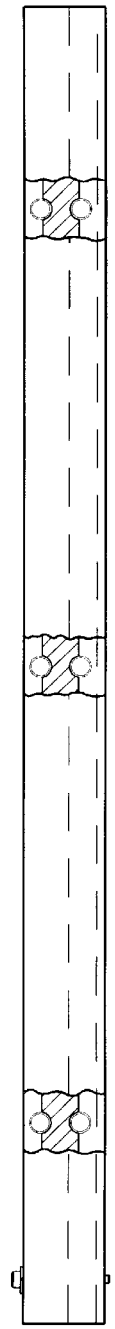

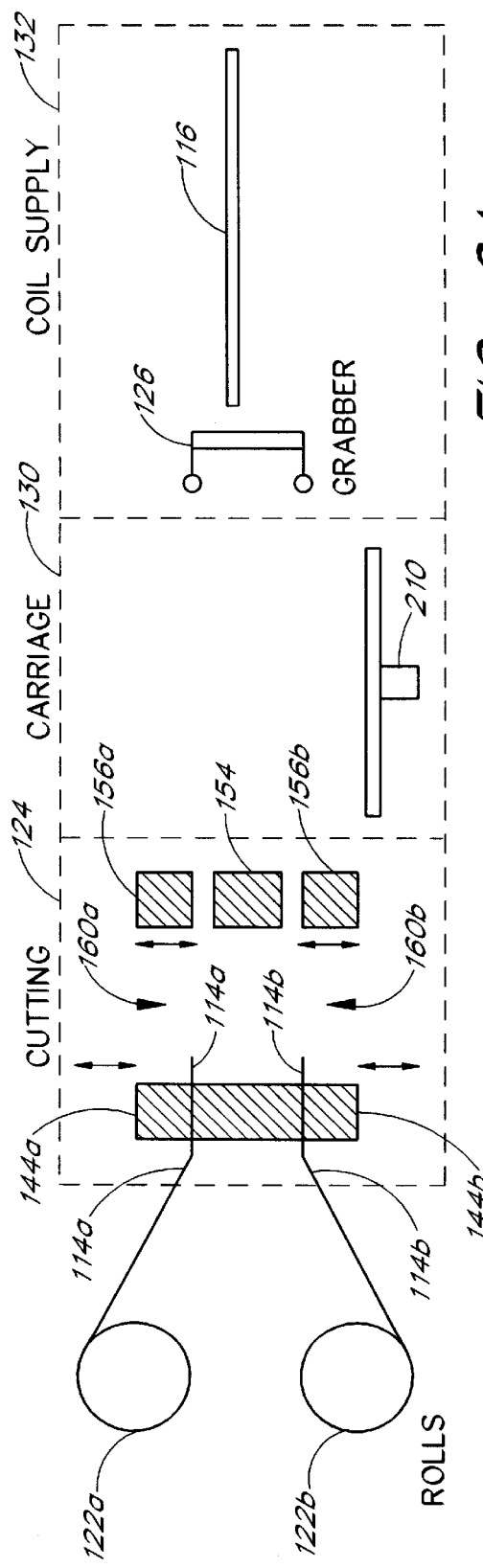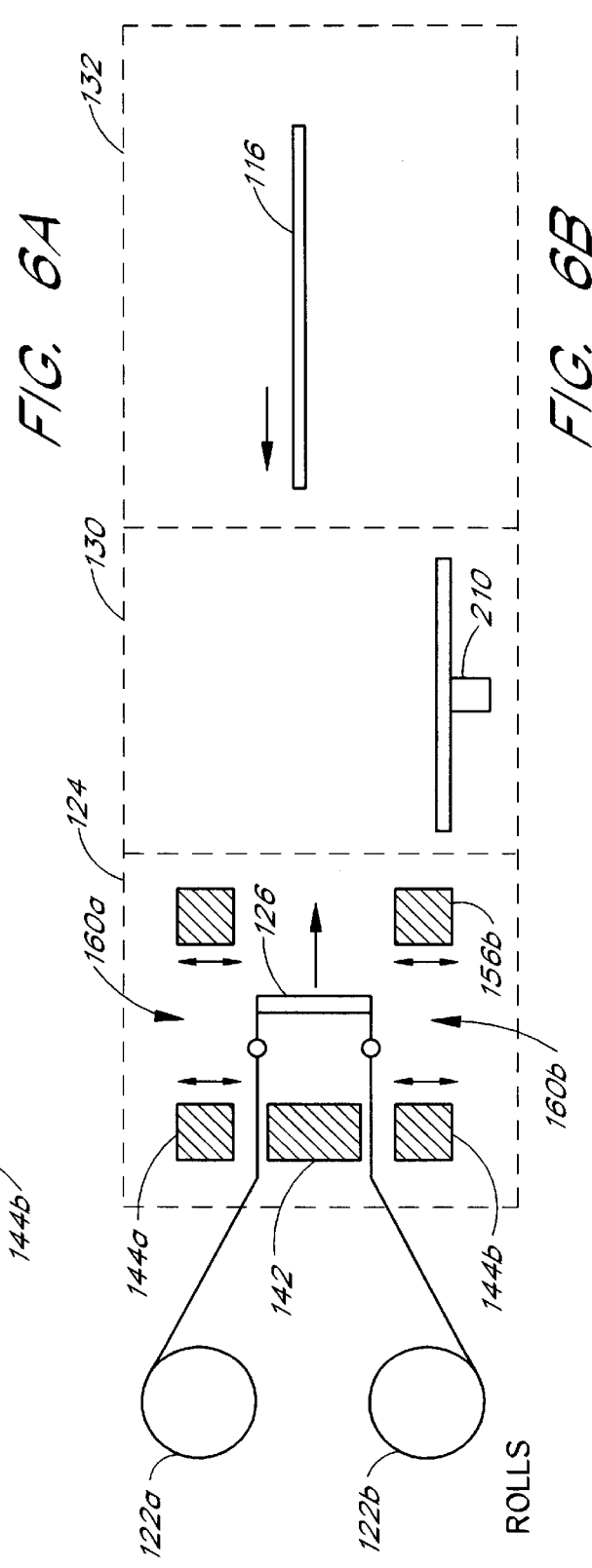

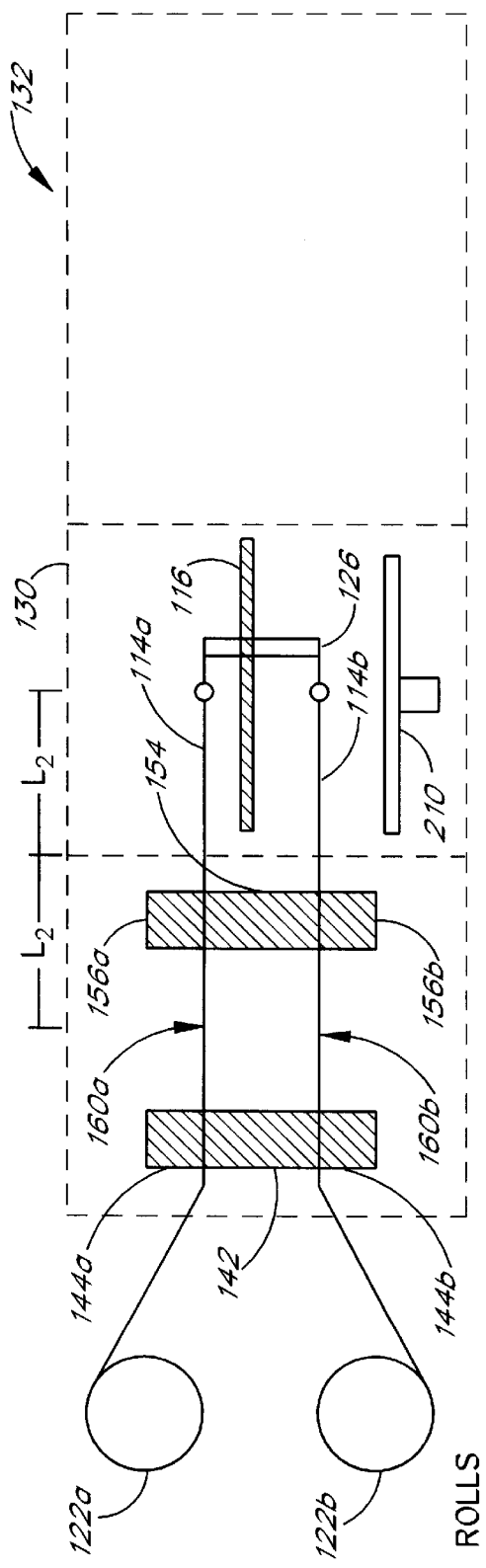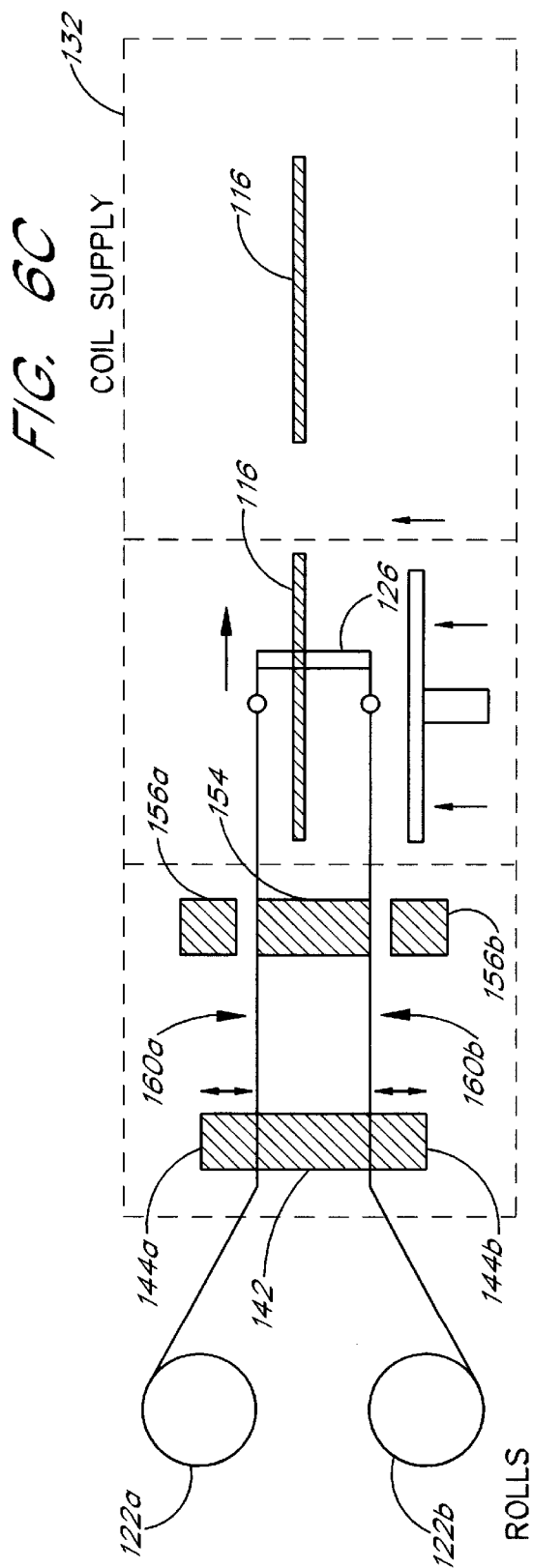

PRINTED CIRCUIT BOARD FABRICATION APPARATUS

BACKGROUND OF THE INVENTION

1. Field of the Invention

The present invention relates to the fabrication of printed circuit boards and, more particularly, concerns an apparatus for, and a method of, assembling copper-caul-copper elements used in the fabrication of printed circuit boards.

2. Description of the Related Art

Printed circuit boards are used in most electronic applications. In one of its simplest forms, the printed circuit board has two sides with conductive traces that are separated by an insulating layer. Electronic devices, such as transistors, resistors, and the like, are positioned on the first side of the circuit board so that the traces interconnect the different devices. However, it may be difficult to interconnect two devices on one side of a board having multiple devices and multiple traces while maintaining isolation between different sets of devices. Consequently, traces are also formed on the second side of the printed circuit board in positions where holes can be drilled through the insulating layer to the traces on the second side to thereby interconnect devices on the first side of the printed circuit board. In more complex printed circuit boards, the insulating layer is comprised of multiple layers of pre-preg material where conductive traces are also formed in the prepreg material. The multiple layers of pre-preg boards are separated from each other by insulating layers, and holes of varying depths are drilled into the multiple layers to interconnect devices using the traces formed on the pre-preg boards.

A common method of forming printed circuit boards, including multiple layer printed circuit boards, begins with positioning a thin layer of copper on a plate known as a caul. The caul is generally a steel plate that has been finely milled so that it is extremely flat. This allows the copper layer to be positioned on the caul so that the copper layer lies substantially flat on the caul. It is understood that the layer of copper can be very thin, e.g., on the order of one or two mils thick, which requires that the caul be milled to a very fine tolerance so that the copper layer will rest uniformly on the caul.

Subsequent to the layer of copper being positioned on the caul, one or more layers of insulating material or prepreg material are then positioned on the upper surface of the layer of copper. Preferably, the layer of copper has been treated so that one side is covered with an epoxy that will subsequently adhere to the layer of insulating material. Once the layer of insulating material has been positioned on the layer of copper, another layer of copper is then positioned over the layer of insulating material, with another caul material positioned on top of the second layer of copper.

In general, multiple layers of cauls, copper, and insulators are assembled in this fashion into what is generally referred to as a book. The book of copper layers, cauls, and insulating materials is then inserted into a composite board press, such as the composite board press described in U.S. Pat. No. 4,857,135. In this type of press, the book is positioned between a pair of heated platens wherein the book is simultaneously heated and compressed by the platens. Further, the composite board press is typically under vacuum, and the combined effects of the heating, compression and vacuum causes resin in the insulating material to flow uniformly and thereby uniformly adhere the copper layers to the insulating material.

Subsequently, the book is removed from the oven and is separated into printed circuit boards which are comprised of two uniform layers of copper separated by the insulating layer. The two uniform layers of copper can then be lithographically etched so as to define the traces used to interconnect devices that are then positioned on the board.

The assembly of the books is thus a critical component in the fabrication of printed circuit boards. In order to reduce the costs of fabricating printed circuit boards, it is desirable to automate the book assembly process. Generally, previous approaches to automate the book assembly process have resulted in the copper being cut and then positioned on the caul at a first station, and then the caul and copper being moved to a second station wherein the insulating layer or multiple layers of pre-preg is then positioned on top of the copper. Subsequently, the element would then be moved either back to the first station or to yet a third station, wherein another layer of copper and a caul is then positioned on top of the insulating layer(s). However, this particular approach is inefficient and expensive in that it requires the book to be moved back and forth between multiple stations and may even require multiple stations performing nearly identical functions.

Further, the insulating layer is generally comprised of glass fibers that are bound within an epoxy mesh. The insulating layer can introduce a large amount of contaminants, e.g., dust and the like, into the environment where the layers of insulating layers are being positioned on the copper. These contaminants can come to rest on a caul prior to the positioning of a layer of copper on the caul, which results in non-uniformity of the layer of copper, i.e., the layer of copper becomes nonplanar. This can further result in the layer of copper not adhering to the epoxy at particularized locations on the printed circuit board. This problem is accentuated where very thin layers of copper and extremely small traces are being formed from the very thin layers of copper, as the very thin traces will be more likely to break at places where they are not adequately adhered to the insulating layer.

Hence, there is a need for a process and apparatus that assembles books for printed circuit boards wherein copper plates can be positioned on cauls in an efficient manner. Further, there is a need for a method and apparatus that provides efficient assembly of cauls and copper layers while reducing the risk of contamination as a result of subsequent positioning of insulating layers on the layers of copper.

SUMMARY OF THE INVENTION

The aforementioned needs are satisfied by the present invention, which is comprised of an apparatus that, at a single station, cuts two sheets of copper and then positions the two sheets of copper on a top and a bottom surface of a caul. The copper-caul-copper (CCC) element can then be removed to a separate station where the element can be assembled with insulating layers and other CCC elements to form a book.

Preferably, the copper is positioned adjacent both sides of a caul in an environment that is removed from the layers of insulating material. Hence, the risk of contamination at the copper-caul interface is reduced. Further, the two layers of copper are preferably cut simultaneously and then simultaneously drawn out of a cutting device while the caul is being simultaneously positioned in the carriage section and positioned adjacent the top and bottom side of the caul. It will be appreciated that this results in efficient formation of the copper-caul-copper element, as this reduces the need to move the copper-caul-copper element, or any subelement thereof, between stations.

In one aspect of the present invention, the apparatus is comprised of a roller section having a first and second roll of copper, a cutter section having a first and second clamp mechanism and a cutting knife, a grasping device for pulling cut pieces of copper out of the cutting section and a carriage section that receives a caul and the copper pieces where the CCC element is then assembled. In this aspect, the first and second clamping mechanisms are comprised of a front and rear clamp, and the grasping device is configured to grasp an outer edge of the sheets attached to the first and second rolls of copper and draw the first and second rolled sheets of copper forward past the front clamp. The clamping mechanism then clamps the first and second rolled sheets of copper so that they are clamped between the front and rear clamps. The cutting device then cuts the first and second rolled sheets of copper so that a first and a second cut sheet of copper of a desired length are produced.

The front clamps are then released so that the grasping device can fully remove the cut sheets of copper from the cutting section and position these sheets in the carriage section. The carriage section is preferably configured to receive the caul nearly simultaneously with receiving the cut copper sheets so that the caul is positioned adjacent the cutting section with a first and a second side of the caul exposed. The grasping device positions the first and second cut sheets of copper adjacent the first and second sides of the caul, respectively, for subsequent removal of the copper-caul-copper element to an insulating layer positioning station. The insulating layer positioning station is preferably isolated from the CCC element formation apparatus so that contaminants produced by handling of the insulating layers are substantially excluded from the vicinity of the copper-caul-copper element formation apparatus.

In the preferred embodiment, the first and second rear clamps of the clamping mechanism are comprised of a fixed clamp box and top and bottom moveable clamp wedges. When the first and second rolled sheets of copper are pulled through the cutting section, the first and second rear moveable clamp wedges move downward so as to capture the first and second rolled sheets between the moveable clamp wedges and the clamp box substantially along the entire width of the first and second rolled sheets. Further, in the preferred embodiment, the first and second forward clamps of the clamping mechanism is comprised of a moveable clamp box that is positioned between the first and second rolls and first and second forward clamping wedges. Preferably, the forward clamp box is comprised of two clamp box elements that are moveable in a direction transverse to the movement of the first and second forward clamping wedges, so that the clamp block can be removed from a position between the first and second rolled sheets to permit the grasping device to grasp the rolled sheets and draw them through the cutting section. The forward first and second clamp wedges can then be positioned adjacent the forward clamp box to securely clamp the first and second rolled sheets between the moveable clamp wedges and the clamp box during the process of cutting the first and second rolled sheets.

It will be appreciated that handling of the first and second copper rolled sheets to draw them through the clamping mechanism for the cutting process and then out of the clamping mechanism for subsequent deposition onto the caul requires that the grasping device be capable of uniformly grasping the end of the rolled sheets and drawing them outward while maintaining the rolled sheets in a substantially planar configuration. In the preferred embodiment, the grasping device is comprised of two capture members, one for each rolled sheet, wherein the capture devices include a channel with an axially extending member positioned along the length of the channel. The channel is mounted on a track and is oriented so that the channel and the moveable member extend across the width of the first and second rolled sheets.

Further, positioned within the channel adjacent a bottom surface of the moveable member is a bladder which is configured so that inflation of the bladder uniformly moves the moveable member outward of the channel. Preferably, a plate is positioned above the opening of the channel containing the moveable member and extends substantially along the entire length of the moveable member so that inflation of the bladder results in the moveable member moving outward so as to be adjacent the plate.

Hence, in the preferred embodiment, the grasping device is positioned so that an end of the rolled sheet of copper is positioned between the moveable member and the plate. The bladder is then inflated so as to move the moveable member outward uniformly along its entire length to thereby capture the edge of the copper sheet between the capture member and the moveable member. The grasping device can then be moved so as to move the captured piece of copper into a desired orientation, e.g., either into the clamping mechanism or adjacent the caul.

The apparatus of the present invention therefore allows for CCC elements to be rapidly assembled at one station where the station can be removed from contaminants created by handling of the insulating layers. The apparatus greatly facilitates building of CCC elements used in the assembly of books of uncured printed circuit boards. These and other objects and advantages of the present invention will become more fully apparent from the following description in reference to the accompanying drawings.

BRIEF DESCRIPTION OF THE DRAWINGS

FIG. 1 is a front elevation view of an automated printed circuit board fabrication line;

FIG. 1A is an exemplary copper-caul-copper (CCC) element assembled using the apparatus and method of the preferred embodiment;

FIG. 3B is a front elevation view of the cutter section of FIG. 3A;

FIGS. 5A and 5B are cross-sectional views of a capture member of the grabbing device shown in FIGS. 4A-4B;

FIG. 5C is a top view of a capture member shown in FIGS. 5A and 5B; and

FIGS. 6A through 6E are schematics which illustrate the operation of the apparatus shown in FIG. 2.

DETAILED DESCRIPTION OF THE PREFERRED EMBODIMENT

Figure 2A:
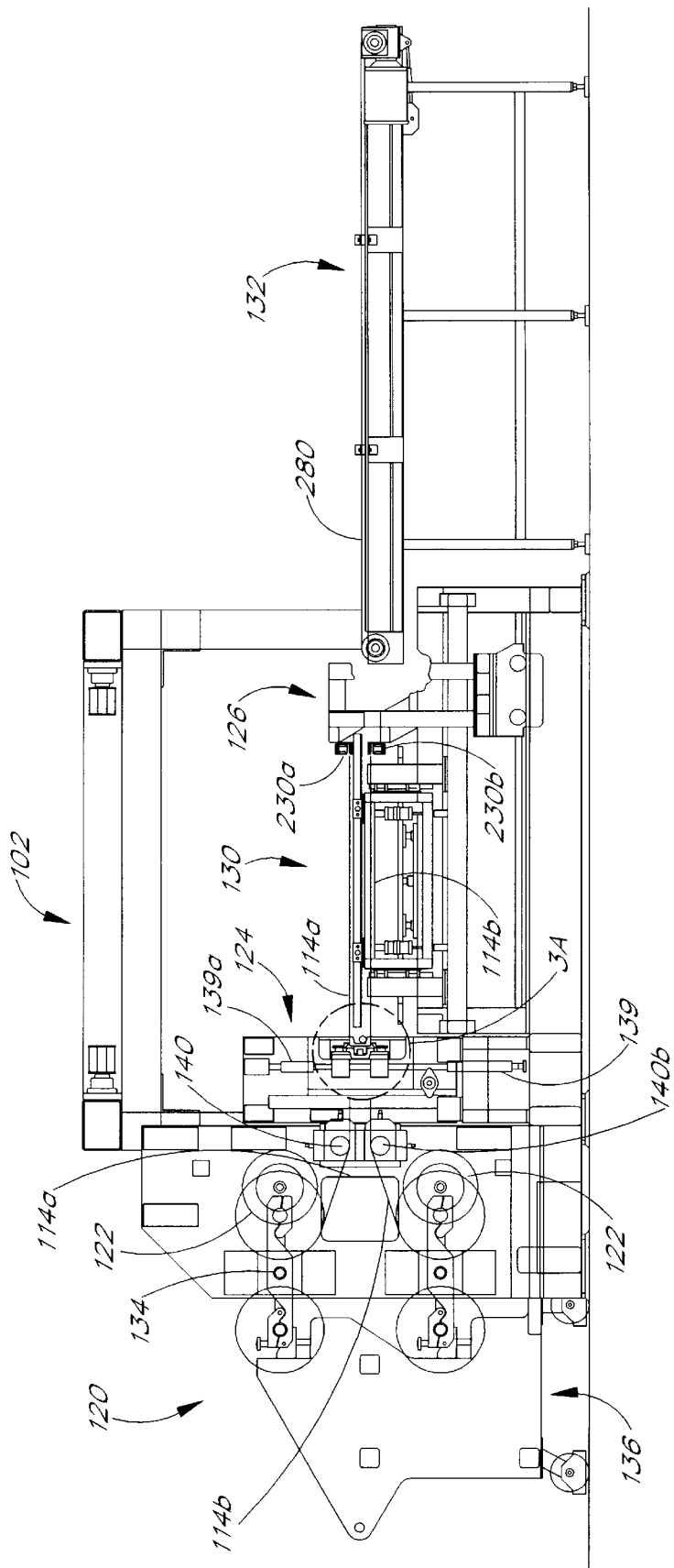
FIG. 2A is a side elevation view of a copper-caul-copper element assembly apparatus of the preferred embodiment used in the fabrication line shown in FIG. 1.

Reference will now be made to the drawings wherein like numerals refer to like parts through.

FIG. 1 is a front elevational view of an automated printed circuit board fabrication assembly 100. In the assembly 100, books comprised of cauls, layers of copper and then layers of either insulator or pre-preg material are assembled for subsequent positioning within a heated vacuum press. The assembly 100 includes a copper-caul-copper (CCC) element assembly apparatus 102 wherein CCC elements of the books are assembled. The CCC elements are then preferably transferred to an insulation/pre-preg assembly apparatus 104 via a transfer head apparatus 110. The transfer head apparatus 110 includes a grasping mechanism that is capable of capturing and moving the CCC elements in a manner that will be described in greater detail below. The assembly 100 may also include other stations or apparatus 106 wherein further processing of the elements comprising the books that are then formed into the finished printed circuit boards is performed.

As shown in FIG. 1, the insulation layer assembly apparatus 104 is positioned away from the CCC element assembly apparatus 102. This allows the CCC elements to be assembled in an environment where particulates from the insulation layers are less likely to be deposited at the interface between the copper and caul surfaces. It will be appreciated that in some installations, the installation assembly apparatus 104 may be positioned in a different room than the CCC element assembly apparatus 102 and that the two rooms may be kept at different air pressures to minimize the flow of particulates from the insulation layer assembly apparatus 104 to the copper-caul-copper element apparatus 104.

FIG. 1A illustrates a typical copper-caul-copper element 112 that is assembled using the apparatus 102. The CCC element 112 is comprised of two thin layers of cut copper sheets 115a and 115b with a caul 116 interposed therebetween. A typical element 112 is 36 inches wide and 48 inches long. The layers of copper 115a and 115b, are typically on the order of 2–10 mils thick and the caul 116 is generally comprised of a steel sheet that is finely milled so as to be very flat and is approximately ¼-inch thick. Since the caul 112 is covered on both sides by the cut copper sheets 115a and 115b, the risk of contamination at the interface between the copper sheets 115a and 115b and the caul 112 is reduced. This results in a lowered likelihood that the copper sheet will have deformities which could cause poor adherence between the copper sheets 115a and 115b and the insulation layers in the final product.

It will be appreciated that the automated assembly 100 produces books that will comprised multiple printed circuit boards. The CCC element 112 shown in FIG. 1A provides the upper copper sheet of a first printed circuit board and the bottom copper sheet of a second printed circuit board. While the following description of the apparatus 102 describes the apparatus 102 as producing CCC elements, it will be understood that the bottom and top layers of any book produced by the assembly 100 will have only a caul and a single sheet of copper positioned on the caul. Preferably, the apparatus 102 is computer controlled and can be programmed to produce then end piece copper caul elements as well.

Figure 2B:
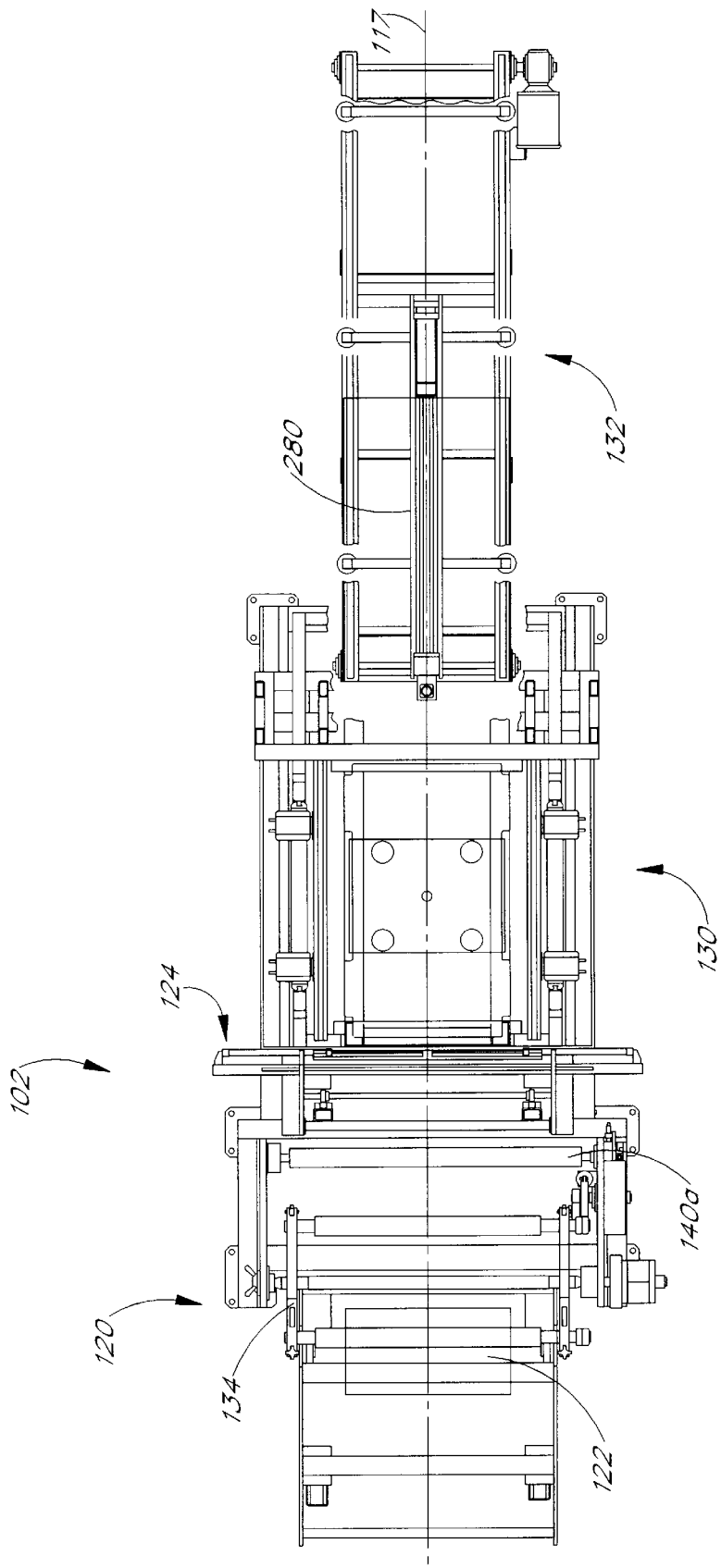
FIG. 2B is a top view of the apparatus of FIG. 2A.

FIGS. 2A and 2B illustrate the CCC element assembly apparatus 102 of the preferred embodiment in greater detail. Specifically, the apparatus 102 includes a roller section 120 which includes rolls of copper 122 that provides rolled sheets of copper 114a and 114b into a cutting section 124. The cutting section 124 cuts the rolled sheets of copper 114a and 114b into the cut copper sheets 115a and 115b that are used to form the CCC element 112 (FIG. 1A). The apparatus 102 also includes a grasping device 126 which both grasps the rolled sheets of copper 114a and 114b off of the rolls and pulls them through the cutter section 124 and also pulls the cut copper sheets 115a and 115b into a carriage section 130. The apparatus 102 also includes a caul supply section 132 which positions the caul 116 into the carriage section 130 preferably nearly simultaneously to receiving the cut copper sheets so that the caul is interposed between the copper sections 115a and 115b.

The roller section 120 includes a plurality of rolls 122 of copper wherein each of the rolls 134 are detachably mounted to a rotatable arm 134. The attachment of the rolls to the rotatable arms 134 permits easy resupply of rolls of copper to the apparatus 102. Specifically, the copper rolls 122 can be positioned on a carriage 136 and a carriage can be wheeled adjacent to the back side of the roller section 120. When a roll in the roller section 120 is empty, the rotatable arm 134 can be attached to a new roll on the carriage 136 and the arm 134 rotated so that the full roll 122 is in a position to supply copper to the cutting section 124 via entry rollers 140a and 140b. As is understood in the art, it is often desirable to clean the surface of the copper to prevent the adherence of particulates on the surface of the copper. To this end, tacking rolls may be positioned just prior to the entry to the cutting sections 124 so that they clean the surface of the rolled copper sheets 114a and 114b that are to be positioned adjacent the caul plate 116. As is understood in the art, the tacking rolls are commercially available rolls that will brush against the surface of the caul plate 116 and attract particulates that are adhering to these surfaces.

The cutting section 124 receives the rolled sheets of copper 114a and 114b having a desired width along a centerline axis 117 (FIG. 2B). The cutting section 124 then cuts the rolled sheets of copper 114a and 114b at periodic intervals as the rolled sheets of copper 114a and 114b are drawn through the cutting section 124 so that the cut copper sheets 115a and 115b, having the desired width and a desired length are produced. The copper sheets 115a and 115b are then removed from the cutting section 124 by the grasping device 126 and positioned in the carriage section 130. As the copper sheets 115a and 115b are being removed from the cutting section 124, the caul supply section 132 is providing the caul 116 to the carriage section 130 along the centerline 117 of the apparatus 102. Hence, the copper and the cauls meet and are assembled into the CCC element 112 (FIG. 1A) in the carriage section 130.

Figure 3A:
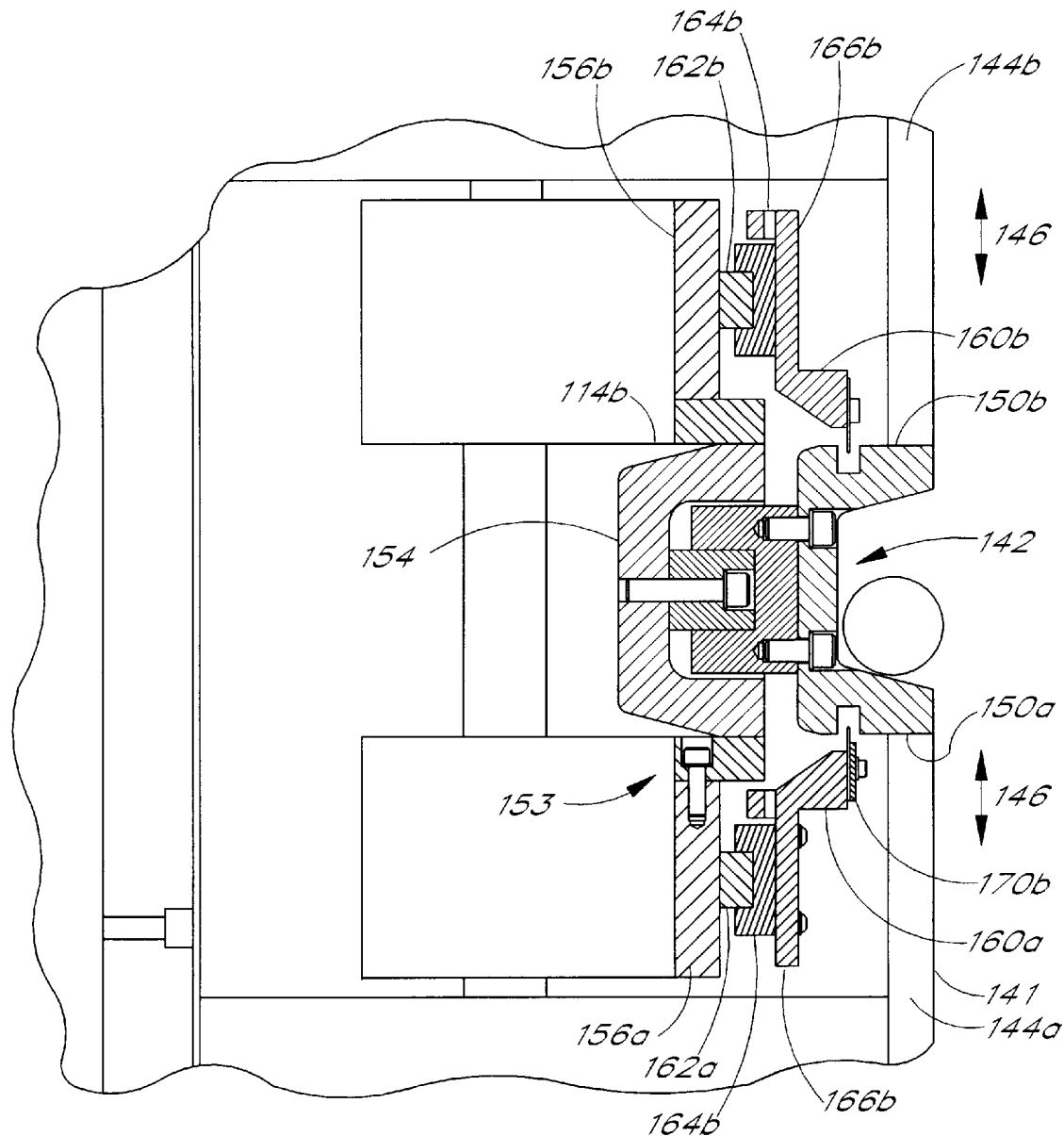
FIG. 3A is side cross-sectional view of a cutter section and clamp assembly of the apparatus of FIG. 2A.

The cutting section 124 is shown in greater detail in FIGS. 3A and 3B. Specifically, the cutting section 124 is configured to clamp the rolled copper sheets 114a and 114b between two sets of clamp assemblies 141 and 153 and then cut the rolled copper sheets 114a and 114b into the segmented sections 115a and 115b shown in FIG. 1A. The cutter section 124 of the preferred embodiment includes a rear clamp 141 which includes a rear fixed clamp block 142 that is positioned between two moveable rear clamp wedges 144a and 144b. The rear clamp wedges 144a and 144b are attached to pistons 139 (FIG. 2A) so as to be moveable both towards and away from the rear fixed clamp block 142 as indicated by the arrows 146. Preferably, the rear fixed clamp block 142 and the rear clamp wedges 144a and 144b extend at least the full width of the copper rolls 114a and 114b. Further, when the rear clamp wedges 144a and 144b are positioned away from the rear fixed clamp block 142, the rolled copper sheets 114a and 114b can be drawn into the cutter section 124 in a manner that will be described hereinbelow, so as to be interposed between the fixed clamp block 142 and the rear clamp wedges 144a and 144b respectively.

The rear fixed clamp block 142 defines two planar surfaces 150a and 150b that the copper sheets 114a and 144b are positioned adjacent when traversing the cutting section 124. A cutout of 152a and 152b are respectively formed in the planar surfaces 150a and 150b. Preferably, the planar surfaces 150a and 150b are least as wide as the copper sheets 114a and 114b and the cutouts 152a and 152b extend the full width of the planar surfaces 150a and 150b. As shown in FIG. 3A, a forward clamp 153 which includes a moveable clamp block 154 is positioned immediately adjacent the planar surfaces 150a and 150b. As will be described in greater detail in reference to FIG. 3B, the forward moveable clamp block 154 can be removed from the interior of the cutting section 124 to allow the grasping device 126 access to the copper sheets 114a and 114b held by the rear clamp 141. Two forward clamp wedges 156a and 156b are positioned adjacent to the top and bottom sides of the front moveable clamp block 154 and are attached to pistons (not shown) so as to be moveable both towards and away from the plane of the rolled copper sheets 114a and 114b, i.e., in the direction of the arrows 146.

Two cutting devices 160a and 160b are respectively mounted on the front clamp wedges 156a and 156b. Specifically, a track 162a and 162b extend along the entire length of the clamp wedges 156a and 156b respectively, i.e., across the entire width of the copper rolls 114a and 114b. A carriage 164a and a carriage 164b are respectively mounted on the tracks 162a and 162b so as to be capable of sliding across the width of the cutting section 124. An arm 166a and an arm 166b are respectively mounted to the carriages 164a and 164b. Two blades 170a and 170b are respectively attached to the arms 166a and 166b so that the blades 170a and 170b are positioned within the cutouts 152a and 152b when the front clamp wedges 156a and 156b are positioned adjacent the front clamp block 154 in the manner shown in FIG. 3A.

The cutting section 124 generally operates as follows. The rear clamp wedges 144a and 144b and the front clamp wedges 156a and 156b are respectively moved away from the rear clamp block 142 and the front clamp block 154. The rolled copper sheets 114a and 114b are then drawn through the cutting section 124 using the grasping device 126 in a manner that will be described below. Subsequently, the rear clamp wedges 144a and 144b and the front clamps wedges 156a and 156b are then positioned adjacent the rear clamp block 142 and the front clamp block 154 respectively. This results in a section of the copper sheets 114a and 114b being securely captured between the rear clamp 141 and the front clamp 153. Further, the cutting devices 160a and 160b, being attached to the front clamp wedges 156a and 156b are positioned adjacent to the rolled copper sheets 114a and 114b. Preferably, when the rolled copper sheets 114a and 114b are drawn through the cutting section 124, the cutting devices 160a and 160b are located at the side of the cutting section 124 so that the rolled copper sheets 114a and 114b can be drawn into the cutting section 124 without hindrance. Once the copper sheets 114a and 114b are securely captured between the two clamps 141 and 153, the cutting devices 160a and 160b traverse the width of the copper sheets 114a and 114b, respectively thereby severing the copper sheets 114a and 114b and producing the sheets 115a and 115b. Subsequently, the forward clamp wedges 156a and 156b are removed away from the forward clamp block 154 thereby releasing the cut copper sheets 115a and 115b. The cut sheets 115a and 115b can then be removed from the cutting section 124 and positioned in the carriage section 130 in the manner that will be described below.

FIG. 3B is a front elevation view of the cutting section 124 which illustrates the front moveable clamp block 154 and the front clamp wedges 156a and 156b in greater detail. Specifically, the front clamp block 154 is comprised of two horizontally moveable block members 172a and 172b. The block members 172a and 172b are moveable in the direction of the double headed arrow 171, i.e., transverse to the centerline 117 (FIG. 2B) of the apparatus 102. Specifically, the block members 172a and 172b are mounted on a track and attached to pistons 174a and 174b respectively so that the block members 172a and 172b can be inserted into an opening 176 which defines the path of the copper sheets 114a and 144b through the cutting section 124. Hence, the front moveable clamp block 154 can be removed from the opening 176 by actuation of the pistons 174a and 174b thereby provide access to the copper sheets 114a and 114b positioned within the cutting section 124. Subsequently, the block members 172a and 172b can be moved towards each other so that the block members 172a and 172b form the clamp block 154 of the cutting section 124 as shown in FIG. 3A. FIG. 3B further illustrates that the front clamp wedges 156a and 156b extend substantially the entire width of the opening 176 and are connected to pistons 182a and 182b so as to be moveable in the direction of the arrow 146 as described above.

Figure 4A:
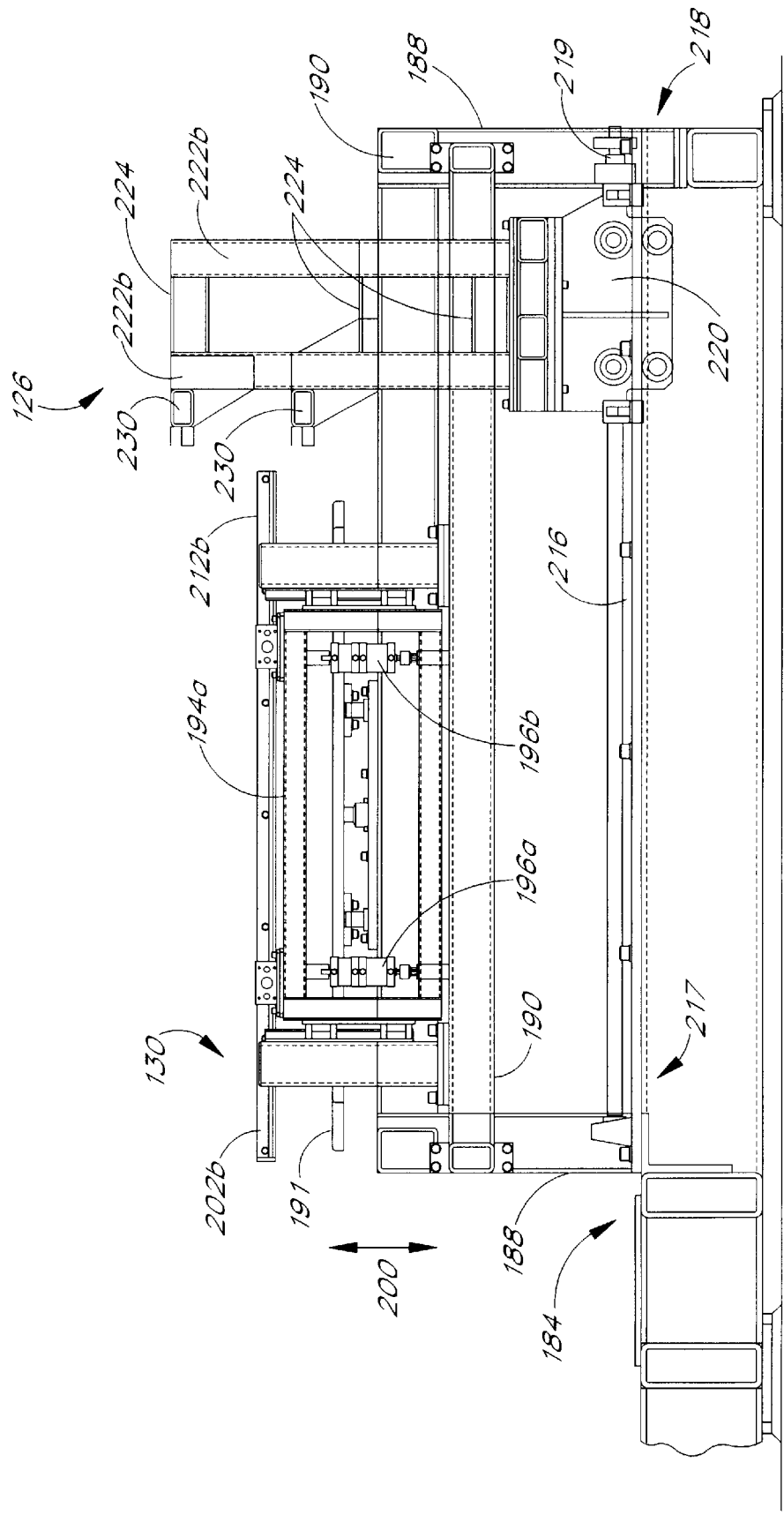
FIG. 4A is a side elevation view of a carriage section and grabbing device of the apparatus of FIG. 2A.
Figure 4B:
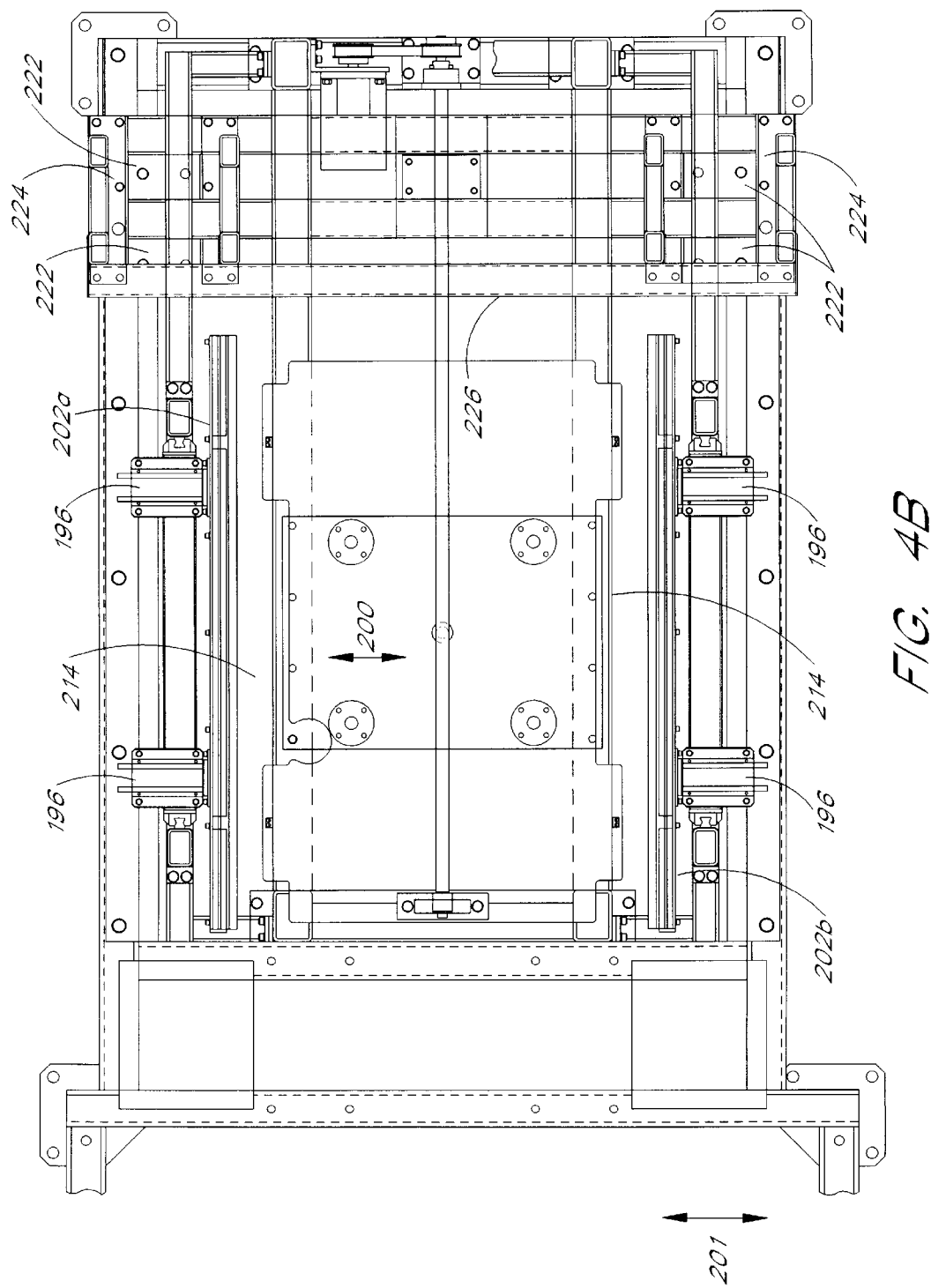
FIG. 4B is a top view of the carriage section and grabbing device of FIG. 4A.

FIGS. 4A and 4B illustrate the carriage section 130 and the grasping device 126 of the apparatus 102 in greater detail. Specifically, the carriage section 130 includes a frame 184 that is positioned on the floor. The frame 184 includes two vertically extending members 186 and 188 and a horizontally extending member 190 interconnected between the vertically extending members 186 and 188 so as to be positioned above the floor. Two guide tracks 202a and 202b are connected to the horizontally extending member 190 via two vertically moveable assemblies 194. The vertically moveable assemblies 194 include pistons 196a and 196b that are capable of moving the assembly upward and downward in the direction of arrow 200 in FIG. 4A. The guide tracks 202a and 202b are mounted on the assemblies 194a and 194b respectively so that the guide tracks are moveable in a vertical direction. Further, the assemblies 194a and 194b are also configured so as to be moveable transversely inward and outward in the direction of arrow 201 shown in FIG. 4B away from the center line 117 of the apparatus (FIG. 2B). In the preferred embodiment, the guide tracks 202a and 202b are made of a teflon material and are capable of being positioned adjacent to the opening 176 (FIG. 3B) in the cutting section 124. The guide tracks 202a and 202b are configured to receive the caul plate 116 (FIG. 1A) in the manner that will be described hereinbelow.

FIG. 4A and 4B also illustrate that the carriage section 130 also includes a vertically moveable table 210 that is mounted on the second horizontally extending member 191 of the frame 184. The vertically moveable table 210 includes pistons 212 which are capable of moving the vertically table 210 upward to substantially the same extension as the guide tracks 202a and 202b. FIG. 4B illustrates that the table 210 has cutouts 214 on either side of the upper surface of the table. The purpose of the cutouts 214 is to allow access to an assembled CCC element 112 (FIG. 1A) that is positioned on the table 214 by the transfer head apparatus 110.

FIG. 4A also illustrates the grasping device 126. Specifically, the frame 184 of the carriage section 130 includes a track 216 which extends parallel to the centerline 117 (FIG. 2B) of the apparatus 102 from a first position 217 substantially adjacent the cutting section 124 to a second position 218 substantially adjacent the caul supply section 132.

A cart 220 is positioned on the track 216 so as to be moveable along the track 216. In the preferred embodiment, the cart 220 is moved from the first position 217 to the second position 218 by a motorized screw assembly 219 that provides accurate positioning of the cart 220 along the track 216. The cart 220 includes a plurality of vertically extending members 222 positioned at the outward sides of the cart 220 with a plurality of horizontal braces 224 interconnecting the vertically extending members 222. Further, an upper bracket 226a (FIGS. 1A and 4B) extends transversely between the outward vertically extending members 222a and 222b to form a mounting surface for an upper capture device 230a (FIG. 2A). A lower capture device 230b is then attached or otherwise suspended beneath the upper capture device 230a on the cart assembly 220.

Preferably, the track 216 is positioned outward of the vertical and horizontal supports holding the guide tracks 202a and 202b and the table 210. In addition, the tracks 216 are positioned between the vertical members 184 and 188 of the frame so that the cart 220 travels between these members. As described above, the guide tracks 202a and 202b are mounted on pistons that are attached to the horizontal member 190 that extends the between the vertical members 184 and 188. Further, as shown in FIG. 1A, the upper support bracket 226 is slightly above the guide tracks 202a and 202b so that movement of the cart assembly 220 results in the upper capture device 230a passing over the guide tracks 202a and 202b. In addition, a lower support member 226b (FIG. 1A) is attached to the cart 220 so as to be positioned below the guide tracks 202a and 202b and inward of the structures 194a and 194b. The lower capture device 230b is preferably mounted on the lower support member 226b positioned so as to pass beneath the guide tracks 202a and 202b while the cart assembly 220 moves from the first position 217 immediately adjacent the cutting station 124 to the second position 218 substantially adjacent the caul supply section 132. The capture devices 230a and 230b are described in greater detail in reference to FIGS. 5A through 5C.

Accordingly, movement of the cart assembly 220 along the track 216 results in movement of the capture devices 230a and 230b towards and away from the cutting section 124. The capture devices 230a and 230b can preferably be positioned within the cutting section 124 and actuated to grasp the copper sheets 114a and 114b respectively. The grasping device 126 can then draw the copper sheets 114a and 114b out of the cutting section 124 and into the carriage section 130 by activation of the screw motor 219.

A caul 116 can also be inserted into the tracks 202a and 202b so as to be retained by the tracks 202a and 202b while the grasping device 126 is pulling the copper sheets 114a and 114b out of the cutting device. The caul supply section 132, shown in FIGS. 2A and 2B in the preferred embodiment, is comprised of a track 280 that is positioned at substantially the same height as the guide tracks 202a and 202b. The caul 116 is loaded onto the track 280 which then propels the caul 116 towards the guide tracks 202a and 202b. Preferably, the caul 116 is then inserted into the guide tracks 202a and 202b by the movement of the track 280. Similar to the cut copper sheets 115a and 115b, it is often desirable to clean the caul plate 116 to ensure that contaminants are removed from the caul plate 116. To this end, the caul plates 116 are usually provided to the caul supply section 132 from a cleaning and buffering station (not shown). It may also be desirable to add tacking rolls to the ends of the caul plate supply section 132, adjacent the carriage section so that the number of remaining particulate contaminants are removed from the surfaces of the caul plate 116.

Preferably, the grasping device 126 pulls the rolled copper sheets so that one copper roll 114a is positioned above the caul 116 that is being inserted into the guide tracks 202a and 202b and the other copper roll 114b is positioned below the guide tracks 202a and 202b. Subsequently, the front clamp 141 and rear clamp 153 of the cutting station 124 can be closed around the rolled copper sheets 114a and 114b and the cutting station 124 can be actuated to sever the copper sheets 115a and 115b. The front clamp 153 can then be opened and the grasping device 126 can then be pulled farther away from the cutting section 124 to accurately position the copper sheets 115a and 115b adjacent the caul 116 that is now resting in the guide tracks 202a and 202b. Meanwhile, the rear clamp 141 remains closed on the rolled copper sheets 114a and 114b which has a tail end exposed that the grasping device 126 can grasp on a subsequent cycle. Preferably, the vertically moveable table 210 is being moved upward as the copper sheets 115a and 115b are being drawn out of the cutting station 124 so that the bottom copper sheet 115b is held adjacent the underside of the caul 116 in the manner shown in FIG. 1A by the table 210. Once the vertically moveable table 210 is positioned so that the bottom copper sheet 115b is positioned flush against the bottom side of the caul 116, the guide tracks 202a and 202b are then moved downward so that the copper sheets 115a and 115b and the caul 116 interposed therebetween are resting on the upper surface of the table 210.

In this fashion, the CCC element 112 can be assembled automatically at a station which is removed from the layers of insulating material. Once the CCC element 112 has been assembled and is positioned on the table 210, the transfer head apparatus 110 (FIG. 1) can then be used to grab the copper-caul-copper element 112. Specifically, referring back to FIG. 1, in the assembly 100 of the preferred embodiment, the transfer head apparatus 110 includes two grasping arms 250 positioned on a track above the apparatus 102 which are capable of grasping the CCC element 112 through the cutout 214 (see FIG. 4B) and then lift the CCC element 112 to a different station in the assembly. While in this embodiment, the transfer head 110 is shown as mounted on a track above the carriage section 130, it will be appreciated that the transfer head apparatus 110 could also be floor mounted below the carriage section 130 without departing from the teachings of the invention.

It will be appreciated that the capture devices 230 of the grasping apparatus 126 must be capable of capturing and securely retaining very thin sheets of copper. It will be further appreciated that applications of nonuniform force along the width of the copper sheet may result in bending or damage to the copper sheet. Hence, it is desirable that the captured devices exert a generally uniform force across substantially the entire width of the copper sheets when removing the copper sheets from the cutting station.

An exemplary capture device 230 of the preferred embodiment is illustrated in FIGS. 5A–5C. The exemplary capture device 230 includes a u-shaped bracket 232 that extends generally the width of the copper sheet 114. Positioned within the u-shaped bracket 232 is a moveable member 234 which is captured within the bracket 232 and extends generally the full length of the u-shape bracket 232. An elongated air bladder 236 is positioned within the u-shaped bracket 232 so as to be interposed between a bottom surface 240 of the moveable member 234 and a bottom inner surface 242 of the u-shaped bracket 232. The bladder 236 is inflated with high pressure air that is injected into the bladder through a plurality of inlet hoses 244 to inflate the bladder uniformly substantially along its entire length.

This results in the moveable member moving upwards in the direction of the arrow 246 in the manner shown in FIG. 5B. The captured device 230 also includes a capture member 250 that is positioned above an upper surface of the moveable member 234. Hence, inflation of the bladder 236 results in the upper surface 252 of the moveable member contacting a first surface 254 of the captured member. FIG. 5C illustrates the top view of the moveable member 234 which is preferably made of a high density flexible plastic and is configured so that the upper surface 252 is uniformly smooth and flat. Preferably, the movable member 234 is flexible which allows the movable member 234 to exert a uniform force against the copper sheets 114a and 114b as a result of inflation of the bladder 236 regardless of whether there are any non-uniformities in the copper sheet.

Hence, the grasping device 126 grasps the copper sheets 114a and 114b by positioning the captured devices 230 so that the copper sheets are positioned between the surface 252 of the moveable member 234 and the first surface 254 of the capture member 250. Subsequently, the bladder 236 is then inflated to uniformly move the moveable member 234 to capture the copper sheet 234 between the upper surface 252 and the first surface 254. The upward grasping device 126 is then moved so as to draw the copper sheet outward and at an appropriate time, the air pressure in the bladder is released thereby releasing the copper sheet. Preferably, springs 260 are positioned between a horizontal portion 262 of the u-shaped bracket 232 and a horizontal bottom section 264 of the moveable member 234 to urge the moveable member 234 downward upon deflation of the bladder 236.

The preferred cycle of operation of the apparatus 102 of the preferred embodiment will now be described in reference to FIGS. 6A through 6E. It will be understood from the following description that the operation of the automated apparatus 102 of the preferred embodiment is sufficiently complex to require computer-based industrial controls. In the preferred embodiment, the sections comprising the apparatus 102 are each controlled by a central computer (not shown) such as an IBM compatible PC and a series of programmable controllers that are all programmed to instruct the apparatus to perform the steps outlined below in FIGS. 6A–6E.

Figure 6E:
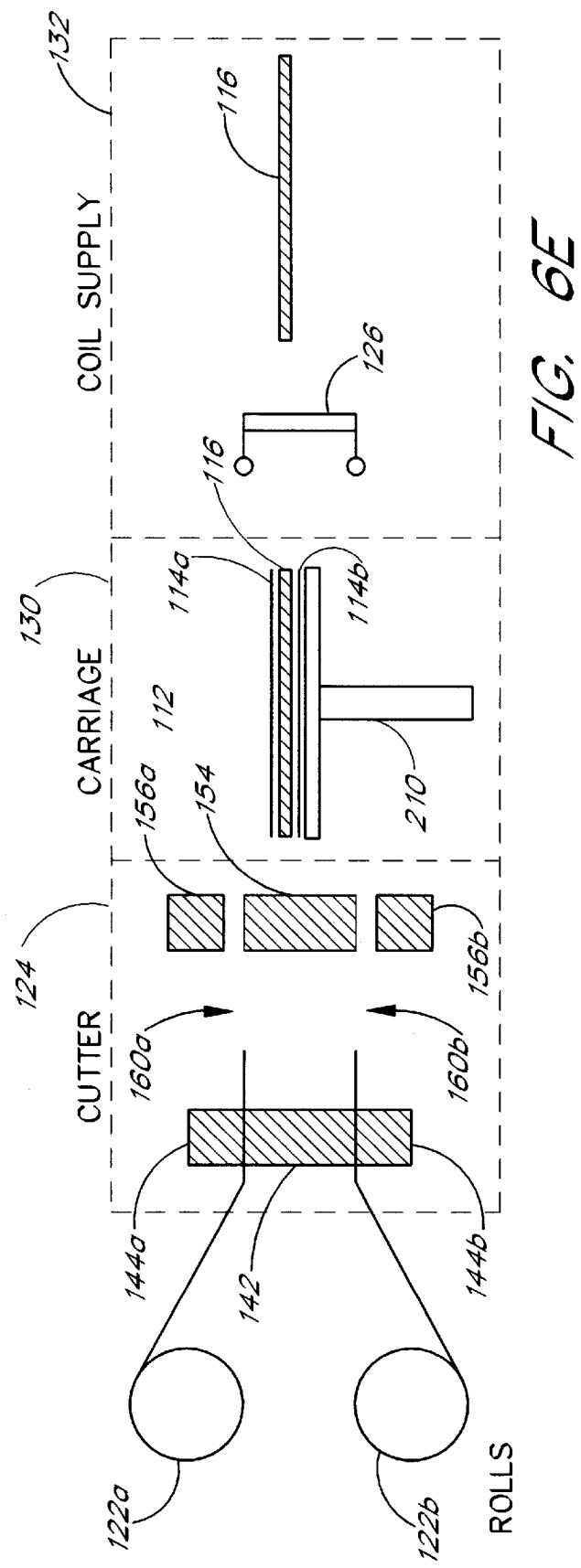

Initially, as shown in FIG. 6A, the rolled copper sheets 114a and 114b are positioned in the cutting section 124 so that the copper sheets 114a and 114b extend beyond the rear clamp 141 with the rear clamp 141 closed. The copper sheets 114a and 114b are either threaded into this position when the apparatus 102 is initially started up for a production run. Subsequently, after each iteration of the cycle illustrated in FIGS. 6A–6E, the copper sheets 114a and 114b remain downstream of the rear clamp 141 after the copper sections 115a and 115b have been cut by the cutting devices 160a and 160b.

The next step of the cycle is illustrated in FIG. 6B wherein the grasping device 126 is positioned so as to extend into the cutting section 124 where the capture devices 230 can capture the ends of the copper rolls 114a and 114b. Positioning the grasping device 126 into the cutting section 124 requires that the front clamp block 154 be removed from the opening 176 at the front end of the cutting section 124. This requires that the pistons 174a and 174b (FIG. 3B) be actuated to remove the block members 172a and 172b respectively from the opening 176 in the previously described manner. The removal of the front clamp block 154 is illustrated in FIG. 6B as an absence of the front clamp block 154.

The captured devices 230a and 230b are then actuated to capture the copper sheets 114a and 114b. The cart 220 (FIG. 4A) is then activated and the rear clamp 141 is disabled to begin drawing the copper sheets 114a and 114b out of the cutting section 124. While the grasping device 126 is removing the copper sheets 114a and 114b from the cutting section, the caul supply section 132 has is moving the caul 115 forward towards the carriage section 130 as is illustrated in FIG. 6B.

FIG. 6C illustrates that the grasping device 126 removes the copper rolls 114a and 114b a first distance $L_1$. The front clamp block 154 is then positioned back in the opening 176 by actuation of the pistons 174 (FIG. 3B) and the rear clamp 141 and the front clamp 153 are then actuated to clamp the copper sheets 114a and 114b in the cutting section. Preferably, the grasping device 126 moves along the tracks 210 the distance $L_1$ wherein the distance $L_1$ has been selected so that the length of copper $L_1$ outside of the cutting section 124 plus the length of copper $L_2$ remaining in the cutting section 124 between the opening 176 and the cutting devices 160a and 160b (FIG. 3A) is equal to the desired length of the cut copper sheets 115a and 115b (FIG. 1). Further, as shown in FIG. 6C, the caul 116 is now preferably positioned within the guide tracks 202a and 202b (FIGS. 4A and 4B) and is suspended between the partially extracted rolled copper sheets 114a and 114b.

FIG. 6D illustrates that the cutting devices 160a and 160b are then actuated to cut the continuous copper rolls 114a and 114b to produce the copper sheets 115a and 115b of the desired length. Further, the front clamp 153 is de-activated, i.e., the clamp wedges 156a and 156b are removed from the clamp block 154, and the grasping device 126 is then actuated to fully remove the copper sheets 115a and 115b from the cutting assembly 124 and position the copper sheets 115a and 115b immediately adjacent the top and bottom surfaces of the caul 116. During this time, the rear clamp 141 remains closed with the copper sheets 114a and 114b extending beyond the clamp 144. Preferably, the table 210 is being actuated simultaneous with the removal of the copper sheets 115a and 115b so as to move upwards to support the bottom copper sheet 115b and the caul 116 while the copper sections 115a and 115b are being removed from the cutting section 124.

FIG. 6E illustrates that the copper sheets 115a and 115b are ultimately positioned immediately adjacent the caul 116 to form the CCC element 112 which is supported by the table 210. The CCC element 112 is then ready for removal by the transfer head 110 in the previously described manner. The apparatus 102 is then ready for another iteration of the previously described cycle which would start with the removal of the front clamp block 154 to allow the grasping device 126 access to the cutting section to remove the next length $L_1$ of the continuous copper sheets 114a and 114b.

It will be appreciated that the preferred embodiment of the apparatus permits assembly of copper-caul-copper elements in an efficient manner as copper sheets are simultaneously positioned on either side of a central caul at a single location. Further, the interface between the caul and the copper is largely contaminant free as the CCC elements are being assembled in a location that can be removed from the position of contaminant causing stations, e.g., the insulation layer station 104. The preferred embodiment will thus improve the manufacturing of printed circuit boards and their components. Specifically, the apparatus of the preferred embodiment can be used to make printed circuit boards that are single or multi-layer. Further, this apparatus can be used to make copper clad laminate board which can then be used to form printed circuit boards. A person skilled in the art will appreciate that the preferred embodiment can be adapted to be used to make all types of boards wherein thin sheets or films of material are being adhered to substrate layers in situations where the thin sheets or films of material must be very flat to properly adhere, i.e., require the use of a caul plate or its equivalent.

Although the foregoing description of the preferred embodiments of the present invention has shown, described and pointed out the fundamental novel features of the invention, it will be understood that various omissions, substitutions, and changes in the form of the detail of the apparatus as illustrated, as well as the uses thereof, amy be made by those skilled in the art without departing from the spirit of the present invention. Consequently, the scope of the invention should not be limited to the foregoing discussion, but should be defined by the appended claims.

What is claimed is:

1. An apparatus for assembling a copper-caul-copper element at a single station to form printed circuit boards, said apparatus comprising:
   at least one roll of copper providing at least one rolled copper sheet of a first width;
   a cutting section which cuts said at least one rolled copper sheet into a first copper sheet and a second copper sheet;
   a carriage section which receives said first and said second copper sheets from said cutting section and maintains the first and second copper sheets in a spaced relationship from each other; and
   a caul supply section which supplies a caul to said carriage section so that said caul is interposed between said first and said second copper sheets while the first and second copper sheets are maintained in the spaced relationship and wherein the carriage assembly positions the first and second copper sheets adjacent the caul so to form said copper-caul-copper element from said first and said second copper sheets and said caul.

2. The apparatus of claim 1, further comprising a transfer head to remove said copper-caul-copper element from said carriage section and transferring said copper-caul-copper element to another apparatus in an assembly line for producing printed circuit boards.

3. The apparatus of claim 1, wherein said at least one roll of copper comprises two rolls of copper sheets providing a first and a second rolled copper sheets and wherein said cutting section simultaneously cuts said first and second rolled copper sheets to produce said first and said second copper sheets.

4. The apparatus of claim 1, further comprising a grasping device which removes said first and said second copper sheets and positions said first and said second copper sheets in said carriage section.

5. The apparatus of claim 4, wherein said cutting section includes two clamp assemblies to clamp said at least one rolled copper sheet prior to cutting said at least one roll of copper.

6. The apparatus of claim 5, wherein one of said two clamp assemblies includes a clamp block and a clamp wedge wherein said clamp wedge is positioned adjacent said clamp block to securely clamp said at least one rolled copper sheet prior to cutting said at least one rolled copper sheet.

7. The apparatus of claim 6, wherein said clamp block is removable from said cutting section to permit said grasping device to grasp said at least one rolled copper sheet in said cutting section and draw said at least one rolled copper sheet a first distance from said cutting section into said carriage section.

8. The apparatus of claim 7, wherein said clamp block is replaceable after said at least one rolled copper sheet has been removed said first distance from said cutting section so that said at least one rolled copper sheet clamped and cut to thereby form said first and said second sheets of copper.

9. The apparatus of claim 8, wherein said grasping device includes a capture device that comprises:
   a U-shaped bracket that is mounted to said grasping device so as to extend substantially along the fist width of said at least one rolled copper sheet;
   a movable member positioned within said U-shaped bracket so as to be movable in a first direction therefrom;
   a capture member positioned in said first direction from said movable member;
   a bladder positioned within said U-shaped bracket, wherein said bladder is inflatable and, when inflated, induces said movable member to move towards said capture member thereby capturing an end of said at least one rolled copper sheet between said capture member and said movable member substantially along said first width of said at least one rolled copper sheet.

10. The apparatus of claim 4 wherein said carriage section comprises:
    two guide tracks spaced so as to receive said caul from said caul supply section; and
    a table which is movable from a first position to a second position, wherein said table in said first position allows said grasping device access to said at least one rolled copper sheet in said cutting section and wherein said table in said second position supports said second sheet of copper in a position wherein said second sheet of copper is adjacent a bottom side of said caul.

11. The apparatus of claim 10, wherein said grasping device removes said first sheet of copper from said cutting section so that said first sheet of copper is positioned adjacent a top side of said caul and wherein said grasping device removes said second sheet of copper from said cutting section so that said second sheet of copper is positioned adjacent said bottom side of said caul.

12. The apparatus of claim 11, wherein said guide tracks are removable so that said copper-caul-copper element comprising said first copper sheet and said second copper sheet with said caul interposed therebetween is supported only by said table.

13. The apparatus of claim 12, wherein said table includes cut-outs to provide access to said element for a transfer head assembly.

14. An apparatus for producing copper and caul elements at a single station to form printed circuit boards, said apparatus comprising:
    at least one rolled copper sheet;
    a cutting section which cuts said at least one rolled copper sheet into a first cut copper sheet and into a second cut copper sheet;
    a carriage section positioned immediately adjacent said cutting section which receives said first and said second cut copper sheets from said cutting section and maintains said first and said second cut copper sheets in a spaced relationship from each other; and
    a caul supply section which supplies a caul to said carriage section as said carriage section receives said first and said second cut copper sheets so that said caul is interposed between said first cut copper sheet and said second cut copper sheet to thereby form said copper-caul-copper element.

15. The apparatus of claim 14, wherein said at least one rolled copper sheet is comprised of a first and a second rolled sheets of copper and wherein said cutting section cuts said first and second rolled sheets of copper to produce said first and said second cut copper sheets.

16. The apparatus of claim 15, wherein said carriage section receives said first and said second cut copper sheet simultaneously with said caul and assembles said first and said second cut sheets of copper with said caul interposed therebetween into a copper-caul-copper element.

17. The apparatus of claim 16, further comprising a transfer head capable of removing said copper-caul-copper element from said carriage section and transferring said copper-caul-copper element to another apparatus in an assembly line for producing printed circuit boards.

18. The apparatus of claim 17, further comprising a grasping device which removes said first and said second cut copper sheets and positions said first and said second, cut copper sheets in said carriage station.

19. The apparatus of claim 18, wherein said cutting section includes two clamp assemblies to clamp said first and second rolled sheets of copper prior to cutting said first and second rolled sheets of copper.

20. The apparatus of claim 19, wherein one of said two clamp assemblies includes a clamp block and a clamp wedge wherein said clamp wedge is positioned adjacent said clamp block to securely clamp said first and second rolled sheets of copper prior to cutting said first and second rolled sheets of copper.

21. The apparatus of claim 20, wherein said clamp block is removable from said cutting assembly to permit said grasping device to grasp said first and second rolled sheets of copper in said cutting section and draw said first and second rolled sheets of copper a first distance from said cutting section into said carriage section.

22. The apparatus of claim 21, wherein said clamp block is replaceable after said first and second rolled sheets of copper is removed said first distance from said cutting section so that said first and second rolled sheets of copper is then clamped and cut to thereby form said first and said second cut sheets of copper.

23. The apparatus of claim 22, wherein said grasping device includes two capturing devices to capture an end of said first and second rolled sheets of copper, wherein each capturing device comprises:

a U-shaped bracket that is mounted to said grasping device so as to extend substantially along a width of said at least one rolled sheet of copper;

a moveable member positioned within said U-shaped bracket to move in a first direction therefrom;

a capture member positioned in said direction from said movable member;

a bladder positioned within said U-shaped bracket, wherein said bladder is inflatable and, when inflated induces said movable member towards said capture member thereby capturing an end of one said first and said rolled sheets of copper between said capture member and said movable member subantially along a width of said one of said rolled sheets of copper.

24. The apparatus of claim 23 wherein said carriage section comprises:

two guide tracks spaced so as to receive said caul from said caul supply section; and a table which is movable from a first position to a second position, wherein said table in said first position allows said grasping device access to said first and second rolled sheets of copper in said cutting section and wherein said table in said second position supports said second cut sheet of copper in a position wherein said second cut sheet of copper is adjacent a bottom side of said caul.

25. The apparatus of claim 24, wherein said grasping device removes said first cut copper sheet from said cutting section so that said first cut copper sheet is positioned adjacent a top side of said caul and wherein said grasping device removes said second cut copper sheet from said cutting section so that said second cut copper sheet is positioned adjacent said bottom side of said caul.

26. The apparatus of claim 25, wherein said guide rails are removable so that said element comprising said first cut copper sheet and said second cut copper sheet with said caul interposed therebetween is supported only by said table.

27. The apparatus of claim 26, wherein said table includes cut-outs to provide access to said element for a transfer head assembly.

* * * * *